United States Patent [19]

Sugino et al.

[11] Patent Number: 5,373,187
[45] Date of Patent: Dec. 13, 1994

[54] PACKAGE BODY FOR INTEGRATED CIRCUIT

[75] Inventors: Katuaki Sugino; Masahito Morita, both of Nagoya, Japan

[73] Assignee: NGK Spark Plug Co., Ltd., Aichi, Japan

[21] Appl. No.: 126,560

[22] Filed: Sep. 27, 1993

[30] Foreign Application Priority Data

Sep. 26, 1992 [JP] Japan ................. 4-280931
Sep. 10, 1993 [JP] Japan ................. 5-250016

[51] Int. Cl.$^5$ ............ H01L 23/48; H01L 29/44; H01L 29/52; H01L 25/60
[52] U.S. Cl. .................. 257/664; 257/691; 257/678; 257/692; 333/247; 333/246
[58] Field of Search ........... 257/691, 666, 664, 662, 257/692, 678; 174/261, 262, 250, 251; 333/247, 263, 246

[56] References Cited

U.S. PATENT DOCUMENTS 4,362,899 12/1982 Porrill ................. 174/262
4,890,155 12/1989 Miyagana et al. ....... 257/664
5,194,833  3/1993 Dougherty et al. ...... 333/247

OTHER PUBLICATIONS

Catalogue published by NGK Spark Plug Co., Ltd., "Nik Technical Ceramics For High Density IC Packages & Multilayer Substances," Sep. 1990.

Choksi et al., "Computer Aided Electrical Modeling of VLSI Packages," IEEE Journal, 1990, pp. 169-172.

Primary Examiner—Andrew J. James
Assistant Examiner—S. V. Clark
Attorney, Agent, or Firm—Sughrue, Mion, Zinn, Macpeak & Seas

[57] ABSTRACT

A package body for an integrated circuit is provided with a substrate having a mounting portion for mounting the integrated circuit. A terminal member for high speed signal input-output is provided on a portion of the substrate except the mounting portion of the substrate. A high speed signal transmission line has one end portion to be connected to the integrated circuit and the other end portion connected to the terminal member and is formed at a portion of the substrate except the mounting portion of the substrate. A plating tie-bar is formed at the substrate so as to extend from an outer periphery edge of the substrate inwardly for electrolytically plating the one end portion of the high speed signal transmission line and the terminal member. A portion of the high speed signal transmission line is arranged more extendingly toward the outer periphery edge of the substrate than the one and other end portions of the high speed signal transmission line, and the inwardly extending end portion of the plating tie-bar is connected to the extending portion of the high speed signal transmission line.

17 Claims, 11 Drawing Sheets

PACKAGE BODY FOR INTEGRATED CIRCUIT

BACKGROUND OF THE INVENTION

1. Field of the Invention

The present invention relates to a package body for an integrated circuit, and more particularly to package bodies of various types such as a pin grid array type, a multi-tip module type, a land grid array type and the like and having a signal transmission structure such as a strip line structure, a microstrip line structure or the like.

2. Discussion of the Prior Art

In such, for instance, a conventional package body for an integrated circuit of the pin grid array type having a strip line structure, a chip cavity 11 is, as shown in FIG. 18, formed on a surface center of a ceramic substrate 10 so as to mount an integrated circuit 40 (see FIG. 19). Furthermore, within an annular portion 12 of the ceramic substrate 10 corresponding to an outer peripheral portion of the chip cavity 11, for instance eight high speed signal transmission lines 20a to 20h and plural low speed signal transmission lines are formed so as to extend radially from the peripheral wall of the chip cavity 11. In FIG. 18 only the low speed signal transmission lines 30a to 30u are illustrated. Each transmission line for the high speed signals and low speed signals is connected at one end portion thereof or a bonding pad to the integrated circuit 40 mounted in the chip cavity 11. For making constant a characteristic impedance of each of the high speed signal transmission lines 20a to 20h, each width of the high speed signal transmission lines 20a to 20h is maintained in a constant, and a ground pattern or an electric source pattern is provided above and below each of the high speed signal transmission lines 20a to 20h within the annular portion 12 of the ceramic substrate 10. In FIG. 19 only the electric source pattern or ground pattern for the high speed signal transmission line 20d is illustrated by the reference numerals 21 and 22. These constructions are also the same as those of each of the low speed signal transmission lines. In addition, the above-mentioned electric source pattern is used as a substitute for a ground pattern because it has the same effect as grounding for a high speed signal.

Furthermore, eight pins 50a to 50h for high speed signal input-output and plural pins for low speed signal input-output are securely arranged on a bottom surface of the annular portion 12 of the ceramic substrate 10 in a lattice configuration as terminal members for signal input-output respectively. In FIG. 18 only the pins 60a to 60u for low speed signal input-output are illustrated. The base portions of these pins are connected to the extending or other portions of the transmission lines for high speed signals and low speed signals through the corresponding via holes (In FIG. 19 only the via hole 23 is indicated.) respectively.

Incidentally, with such a package body for the integrated circuit, electrolytic plating is mostly done on the bonding pads and the pins for improvements of anti-corrosion and bonding with wires. In this case, plating tie-bars 70a to 70h for the high speed signal transmission lines and plating tie-bars for the low speed signal transmission lines (In FIG. 18 only the plating tie-bars 80a to 80u for the low speed signal transmission lines are illustrated.) are formed within the annular portion 12 of the ceramic substrate 10 from the extending portions of the corresponding transmission lines for high speed signals and low speed signals to the outer peripheral edge 12a of the ceramic substrate 10. These plating tie-bars are electrically connected in parallel to each other to for instance a conductor layer which is formed on the outer peripheral edge 12a with coating of conductive paste. Thus, electrolytically plating process of the bonding pads and pins are performed all at once, when an electric current flows through the conductor layer to the plating tie-bars to do electrolytically plating process.

After such electrolytically plating process, however, even if the above-mentioned conductor layer is removed from the outer peripheral edge 12a by grinding, the plating tie-bars for the transmission lines of the high and low speed signals are still remained within the annular portion 12 of the ceramic substrate 10. In this case, although no problems are present for the low speed signal transmission lines due to low frequencies of the low speed signals, there occur inevitably the following phenomena for the high speed signal transmission lines due to high frequencies of the high speed signals.

For easy understanding of the phenomena, a circuit construction (see FIG. 20) formed by the high speed signal transmission line 20d and plating tie-bar 70d connected through the via hole 23 to each other is represented by a distribution constant circuit, as shown in FIG. 21. In this case, a characteristic impedance of the high speed signal transmission line 20d is defined by an impedance Z01 composed of an inductance L=L1 and a capacitance C=C1 whereas a characteristic impedance of the plating tie-bar 70d is defined by an impedance Z02 composed of an inductance L=L2 and a capacitance C=C2. In general, taking account that the characteristic impedance of the high speed signal transmission line 20d is represented by $ZO=(L/C)^{\frac{1}{2}}$, a width of each high speed signal transmission line and distances between these high speed signal transmission lines and the corresponding ground patterns have been only to be designed in advance such that a characteristic impedance required based on properties of the integrated circuit is satisfied with Z01. Considering the above-mentioned distribution constant circuit with reference to the construction of FIG. 20, a high speed signal current i flowing into the pin 50d flows separately into both the high speed signal transmission line 20d and plating tie-bar 70d through the via hole 23. In this case, since an end of the plating tie-bar 70d which is not connected with the high speed signal transmission line 20d is an opened end, a partial current which has flowed into the plating tie-bar 70d is reflected at the opened end of the plating tie-bar 70d and returns to its connecting portion with the high speed signal transmission line 20d and then flows into the high speed signal transmission line 20d so as to join with the partial current flowing into the high speed signal transmission line 20d. This means that the more the above-mentioned joining timing delays or the more the length of the plating tie-bar 70d is long, the more the joined current of both the partial currents becomes considerably smaller than the high speed signal current i, because the partial current flowing through the high speed signal transmission line 20d is flowing precedingly during return time of the partial current flowing through the plating tie-bar 70d.

In other words, considering that a parallel circuit is formed by Z01 and Z02, a synthetic characteristic impedance (hereinafter called as a synthetic characteristic impedance Z) of the distribution constant circuit formed by the above-mentioned separately flowing of the high speed signal current i is given by $Z=Z01\cdot Z02/(Z01+Z02)$. Thus, if for instance $Z01=Z02$, the synthetic characteristic impedance becomes $Z=Z01/2$, reducing to a half of the predetermined characteristic impedance Z01. Therefore, there occur the drawbacks that the actual characteristic impedance of the high speed signal transmission line 20d reduces remarkably more than the designed characteristic impedance due to influences of the impedance of the plating tie-bar 70d caused by flow of the high speed signal current i into the plating tie-bar 70d from the pin 50d. Meanwhile, if Z01 is large compared with Z02, the drawbacks is difficult to occur but it becomes necessary to narrow a width of each plating tie-bar. However, the width of each signal transmission line is designed to be considerably narrow, because of high density wiring of each signal transmission line. Thus, if the width of each plating tie-bar is further narrowed, there is the possibility that each plating tie-bar is broken. This means that it is difficult to resolve the above-mentioned drawbacks by extremely narrowing only the width of each plating tie-bar.

Incidentally, the present inventors have measured such phenomena with an oscilloscope by using Time Domain Reflection measurement method (hereinafter called as TDR measurement method.). The TDR measurement method is a method wherein a characteristic impedance on a certain location is measured in relation to a return transmission time of a signal between one certain and the other locations on a test sample. On the occasion of the measurement, the pin 50d has been removed and a measuring probe has been directly connected to the via hole 23. In this state, the above-mentioned phenomena have been measured with the TDR measurement method by flowing the high speed signal current i into the high speed signal transmission line 20d and plating tie-bar 70d through a measuring cable (a 50-ohm coaxial cable), the measuring probe and the via hole 23. Thus, a measured result shown in FIG. 22 has been obtained.

In this case, a designed characteristic impedance of the high speed signal transmission line 20d is assumed to be 50 ohms, and an end portion (a portion to be connected to the integrated circuit 40) of the same high speed signal transmission line 20d is assumed to be opened. In FIG. 22, the axis of abscissas indicates a return transmission time or a transmitting and reflecting location of the high speed signal current i whereas the axis of ordinates indicates characteristic impedances on each corresponding transmitting and reflecting location of the measuring cable, via hole 23, high speed signal transmission line 20d and plating tie-bar 70d. In this case, in FIG. 22, a region A corresponds to the measuring cable, and a region B corresponds to the measuring probe. A region C corresponds to the via hole 23, plating tie-bar 70d and high speed signal transmission line 20d, and a region D corresponds to an integrated circuit side end portion of the high speed signal transmission line 20d.

Referring to FIG. 22, the region A defines relationship between a return transmission time of the high speed signal current i till each location within the measuring cable and a characteristic impedance on each corresponding transmitting and reflecting location. And the region B defines relationship between a return transmission time of the high speed signal current i till each location within the measuring probe and a characteristic impedance on each corresponding transmitting and reflecting location. Furthermore, the region C defines relationship between a return transmission time of the high speed signal current i till each location between the tip portion of the via hole 23 and the one end portion or bonding pad of the high speed signal current i and a characteristic impedance on each corresponding transmitting and reflecting location. And the region D represents a characteristic impedance of the bonding pad which is maintained to be opened. While the characteristic impedance at the region D originally shows an infinitely great value, it gradually rises in relation to a response speed of the measuring instrument. In this case, with the region C it is recognized that the synthetic characteristic impedance lowers down to 28.7 ohms. This means that the characteristic impedance of the high speed signal transmission line 20d from the location of the pin 50d remarkably lowers compared with the designed characteristic impedance (50 ohms).

In contrast with this, it is considered to shorten a length of each plating tie-bar for the high speed signal transmission lines. However, because of construction of a transmitting circuit it is impossible that all of the pins arranged in the form of lattice configuration are located near the outer edge of the ceramic substrate 10. It is also not always possible to arrange the pins for high speed signal transmission near the outer edge of the ceramic substrate 10, because each location of the pins is determined in relation to design of the integrated circuit. Thus, shortening of the lengths of these plating tie-bars is limited of itself, so long as there premises the structure that the plating tie-bars for high speed signal transmission lines are connected to connecting portions between the corresponding via holes and corresponding high speed signal transmission lines respectively. As a result, it is impossible to resolve the drawbacks that the characteristic impedance of the high speed signal transmission line lowers, as previously described.

SUMMARY OF THE INVENTION

It is, therefore, a primary object of the present invention to provide a package body for an integrated circuit having a plating tie-bar indispensable for manufacturing technique and which properly maintains in an original value a characteristic impedance of a signal transmission line using as a high speed signal transmission line.

According to the present invention, the foregoing objects are attained by providing a package body for an integrated circuit provided with a substrate having a mounting portion for mounting the integrated circuit, a terminal member for high speed signal input-output provided on a portion of the substrate except the mounting portion of the substrate, a high speed signal transmission line having one end portion to be connected to the integrated circuit and the other end portion connected to the terminal member, the high speed signal transmission line being formed at a portion of the substrate except the mounting portion of the substrate, and a plating tie-bar formed at the substrate so as to extend from an outer periphery edge of the substrate inwardly for electrolytically plating the one end portion of the high speed signal transmission line and the terminal member, wherein a portion of the high speed signal transmission line is arranged more extendingly toward the outer periphery edge of the substrate than the one and other end portions of the high speed signal transmission line, and the inwardly extending end portion of the plating tie-bar is connected to the extending portion of the high speed signal transmission line.

Accordingly, the length of the plating tie-bar connected to the extending portion of the high speed signal transmission line located more closely to the outer periphery edge of the package body than the one and other end portions of the high speed signal transmission line becomes short, compared with the case in which the plating tie-bar is connected with a connecting portion between the terminal member and the high speed signal transmission line.

Thus, bad influences given by the plating tie-bar to the characteristic impedance of the high speed signal transmission line with respect to high frequency waves of a high speed signal, that is, a length of a region of the high speed signal transmission line wherein the characteristic impedance lowers may be shortened surely because of shortening of the above-mentioned plating tie-bar in its length. Therefore, in spite of the same plating method as the conventional plating method of plating the pin or the like with the plating tie-bar, it may be minimized that a signal waveform is deformed to cause delay of a signal propagation speed. As a result, according to the present invention, it is possible to provide a package body capable of ensuring stable operation in input-output of a high speed signal and also to provide a package body capable of accommodating a more highly speedy integrated circuit.

Preferably, in the above-mentioned package body for an integrated circuit, the high speed signal transmission line is formed within the interior portion of the substrate located outside the mounting portion of the substrate more extendingly toward the outer periphery edge of the substrate at a portion of the high speed signal transmission line than the one and other end portions of the high speed signal transmission line. The terminal member has a via hole formed within the interior portion of the substrate located outside the mounting portion of the substrate to be connected to the other end portion of the high speed signal transmission line and has a pin or pad for high speed signal input-output provided on a surface portion of the substrate except the mounting portion of the substrate, and the plating tie-bar is formed within the interior portion of the substrate located outside the mounting portion of the substrate or on a surface portion except the mounting portion of the substrate to be connected to the extending portion of the high speed signal transmission line at its inwardly extending end portion.

Preferably, in the package body for an integrated circuit, the substrate is provided with a ceramic substrate having a mounting portion for mounting the integrated circuit and is provided with a multi-layer or single layer membrane formed on one side surface portion of the ceramic substrate except the mounting portion of the ceramic substrate. The terminal member has a main via hole formed within the interior portion of the ceramic substrate located outside the mounting portion of the ceramic substrate and has a pin or pad for high speed signal input-output provided on the other surface portion of the ceramic substrate to be connected to the main via hole. The high speed signal transmission line is provided with a main high speed signal transmission line having one end portion to be connected to the integrated circuit and formed at the multi-layer or single layer membrane so as to extend from the one end portion of the main high speed signal transmission line, the high speed signal transmission line being provided with a subsidiary high speed signal transmission line formed within the ceramic substrate, corresponding to the multi-layer or single layer membrane and having a base end portion connected to the extending end portion of the main high speed signal transmission line through a subsidiary via hole and the other end portion connected to the main via hole. The subsidiary high speed signal transmission line is arranged more extendingly toward the outer periphery edge of the substrate at a portion thereof than the one end portion of the main high speed signal transmission line and the other end portion of the subsidiary high speed signal transmission line, and the plating tie-bar is formed within the ceramic substrate, corresponding to the multi-layer or single layer membrane, so as to extend form the outer periphery edge of the ceramic substrate inwardly and is connected at its inwardly extending end portion to the extending portion of the subsidiary high speed signal transmission line.

Preferably, in the above-mentioned package body for an integrated circuit, the substate has a mounting portion for mounting a plurality of integrated circuits. The high speed signal transmission line has one end portion to be connected to one of the integrated circuits and is arranged more extendingly toward the outer periphery edge of the substrate at its portion than the one and other end portions of the high speed signal transmission line, and the plating tie-bar is connected at its inwardly extending portion to the extending portion of the high speed signal transmission line.

Furthermore, according to another aspect of the present invention, the foregoing objects are attained by providing a package body for an integrated circuit provided with a substrate having a mounting portion for mounting the integrated circuit, plural terminal members for signal input-output provided on a portion of the substrate except the mounting portion of the substrate, plural signal transmission lines having one end portion to be connected to the integrated circuit and the other end portion connected to the corresponding terminal member of the plural terminal members respectively, the plural signal transmission lines being formed at a portion of the substrate except the mounting portion of the substrate, and plural plating tie-bars formed at the substrate so as to extend from an outer periphery edge of the substrate inwardly for electrolytically plating the one end portions of these signal transmission lines and the terminal members respectively, wherein a portion of each of the signal transmission lines is arranged more extendingly toward the outer periphery edge of the substrate than the one and other end portions of each of the signal transmission lines, and the inwardly extending end portion of each of the corresponding plating tie-bars is connected to the extending portion of each of the signal transmission lines.

Accordingly, the length of each of the plating tie-bars connected to the extending portion of each of the corresponding signal transmission lines located more closely to the outer periphery edge of the package body than the one and other end portions of each of the signal transmission lines becomes short, compared with the case in which each of the plating tie-bars is connected with a connecting portion between the corresponding terminal member and the corresponding signal transmission line.

Thus, with respect to each signal transmission line propagating each high speed signal in the signal transmission lines, effects like the above-mentioned effects may be attained. In this case, it is unnecessary to discriminate whether a high speed signal or a low speed signal is propagated through each signal transmission line.

Preferably, in such a package body for an integrated circuit, each of the signal transmission lines is formed within the interior portion of the substrate a surface portion located outside the mounting portion of the substrate more extendingly toward the outer periphery edge of the substrate at a portion of each of the signal transmission lines than the one and other end portions of each of the signal transmission lines. Each of the terminal members has a via hole formed within the interior portion of the substrate located outside the mounting portion of the substrate to be connected to the other end portion of each of the signal transmission lines and has a pin or pad for signal input-output provided on a surface portion of the substrate except the mounting portion of the substrate, and each of the plating tie-bars is formed within the interior portion of the substrate located outside the mounting portion of the substrate to be connected to the extending portion of each of the corresponding signal transmission lines at its inwardly extending portion.

Preferably, in the above-mentioned package body for an integrated circuit, the substrate is provided with a ceramic substrate having a mounting portion for mounting the integrated circuit and is provided with a multi-layer or single layer membrane formed on one side surface portion of the ceramic substrate except the mounting portion of the ceramic substrate. Each of the terminal members has a main via hole formed within the interior portion of the ceramic substrate located outside the mounting portion of the ceramic substrate and has a pin or pad for signal input-output provided on the other surface portion of the ceramic substrate to be connected to the main via hole. Each of the signal transmission lines is provided with a main signal transmission line having one end portion to be connected to the integrated circuit and formed at the multi-layer or single layer membrane so as to extend from the one end portion of the main signal transmission line, each of the signal transmission lines being provided with a subsidiary signal transmission line formed within the ceramic substrate, corresponding to the multi-layer or single layer membrane, and having a base end portion connected to the extending end portion of the main signal transmission line through a subsidiary via hole and the other portion connected to the main via hole. Each of the subsidiary high speed signal transmission line is arranged more extendingly toward the outer periphery edge of the substrate at a portion thereof than the one end portion of the main signal transmission line and the other end portion of the subsidiary signal transmission line, and each of the plating tie-bars is formed within the ceramic substrate, corresponding to the multi-layer or single layer membrane, so as to extend form the outer periphery edge of the ceramic substrate inwardly and is connected at its inwardly extending end portion to the extending portion of each of the corresponding subsidiary signal transmission lines.

Preferably, in the above-mentioned package body for an integrated circuit, the substrate has a mounting portion for mounting plural integrated circuits, and each of the signal transmission lines has one end portion to be connected to one of the integrated circuits and is arranged more extendingly toward the outer periphery edge of the substrate at its one portion than the one and other end portions of each of the signal transmission lines, each of the signal transmission lines being connected at its extending portion to the corresponding inwardly extending end portion of each of the corresponding plating tie-bars.

In the above-mentioned package body for an integrated circuit, each of only the signal transmission lines used as high speed signal transmission lines of the plural signal transmission lines is arranged more extendingly toward the outer periphery edge of the substrate at a portion of each of only the signal transmission lines than the one and other end portions Of each of only the signal transmission lines, and the inwardly extending portion of each of the corresponding plating tie-bars is connected to the extending portion of each of only the signal transmission lines.

BRIEF DESCRIPTION OF THE DRAWINGS

Other objects, features and advantages of the present invention will be readily appreciated from the following detailed description of preferred embodiments thereof when considered with reference to the accompanying drawings, in which.

DESCRIPTION OF THE PREFERRED EMBODIMENTS

Figure 1:
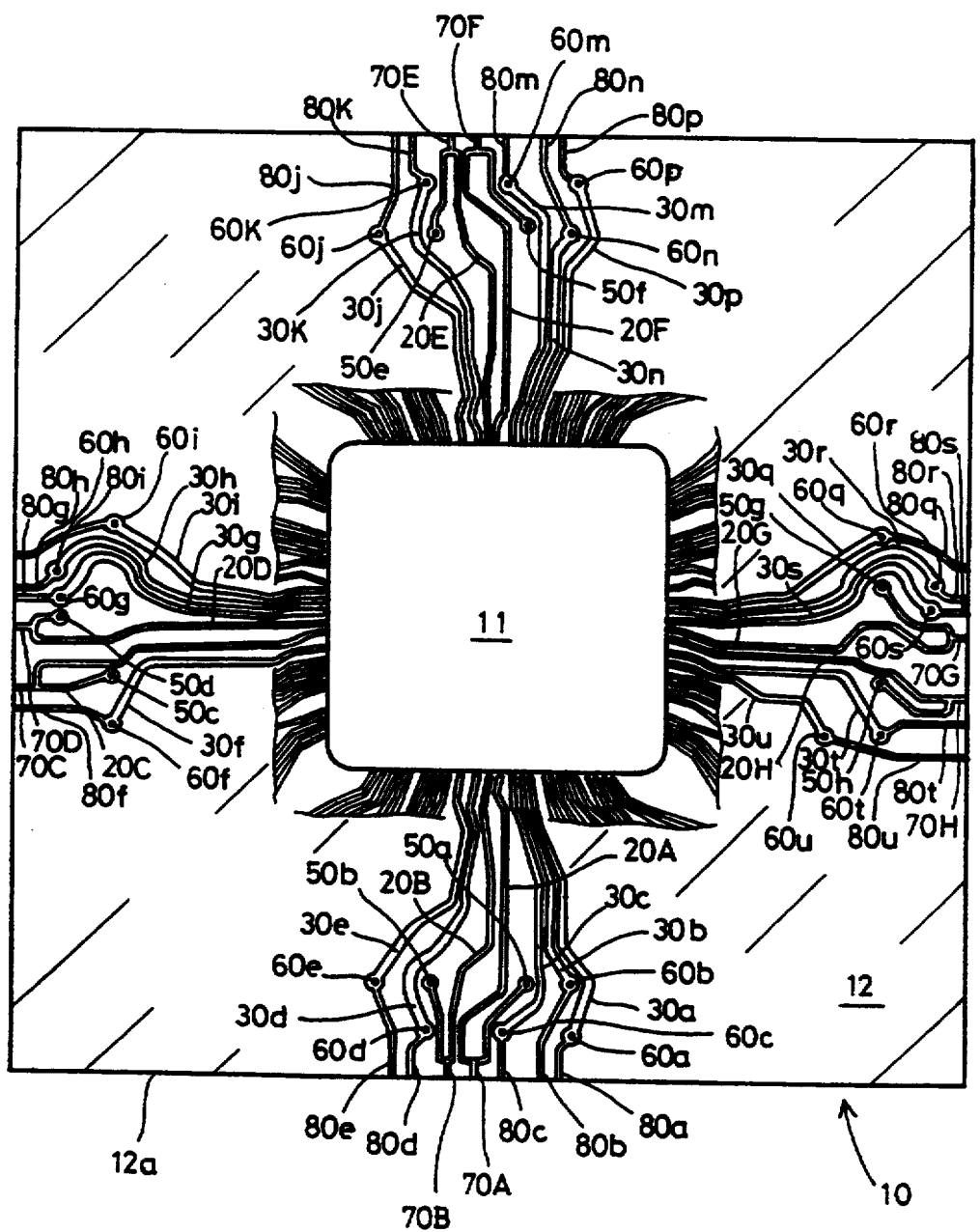
FIG. 1 is a cross-sectional view of a package body for a pin grid array type integrated circuit of a strip line structure indicating a first embodiment of the present invention and taken along a line 1—1 of FIG. 3.
Figure 2:
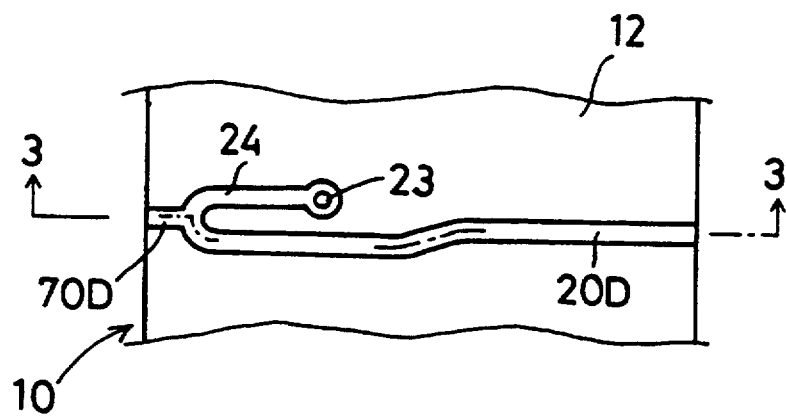
FIG. 2 is a partially enlarged broken plan view of FIG. 1.
Figure 3:
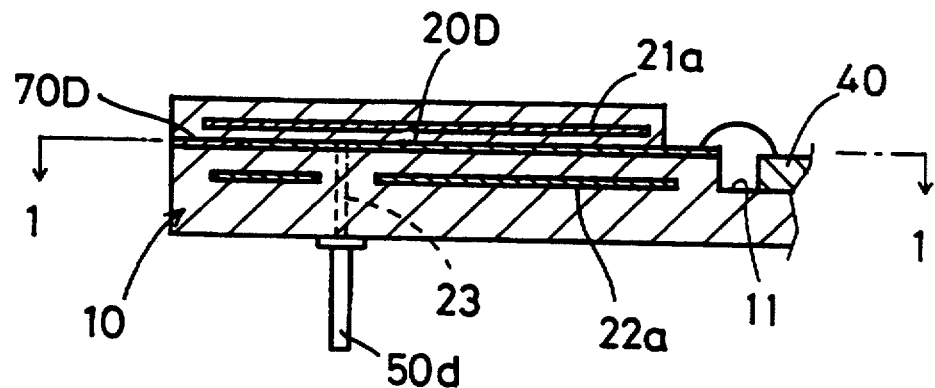
FIG. 3 is an enlarged cross-sectional view taken along a line 3—3 of FIG. 2.

Hereinafter, a first embodiment of the present invention will be explained with reference to the accompany drawings. FIG. 1 to FIG. 3 illustrate a package body for an integrated circuit of the pin grid array type in accordance with the present invention. This package body is provided with the ceramic substrate 10 which has described in the prior art of the specification. On the ceramic substrate 10, the above-mentioned chip-cavity 11 and the annular portion 12.

Next, the construction of an essential portion of the present invention will be explained. The ceramic substrate 10 is provided with a signal transmission structure given by a strip line structure, as shown in FIG. 3. As shown in FIG. 1, the plural low speed signal transmission lines, plural pins for low speed signal input-output and pins 50a–50h for high speed signal input-output which have been described in the prior art of the specification are provided in the signal transmission structure. In this case, the plural low speed signal transmission lines include the low speed signal transmission lines 30a–30u, and the pins for low speed signal input-output include the pins 60a–60u for low speed signal input-output. Furthermore, high speed signal transmission lines 20A–20H are provided within the annular portion 12 of the ceramic substrate 10 in replacement of the above-mentioned high speed signal transmission lines 20a–20h.

The high speed signal transmission lines 20A–20H are formed so as to extend radially from the peripheral wall of the chip cavity 11. These high speed signal transmission lines 20A–20H are connected at their one end portions or bonding pads to the integrated circuit 40 (see FIG. 3) mounted in the chip cavity 11. Meanwhile, The other end portions of these high speed signal transmission lines 20A–20H are connected through the corresponding via holes to secured portions of the pins 50a–50h for the corresponding high speed signal input-output respectively. Extending portions of the high speed signal transmission lines 20A–20H from the corresponding via holes connected to the corresponding pins 50a–50h are formed to curvedly extend closer to the outer peripheral edge 12a of the annular portion 12 of the ceramic substrate 10 than locations of the corresponding via holes, as shown in FIG. 1. Plating tie-bars 70A–70H for high speed signal transmission lines are formed to extend from the outer periphery edge 12a into the annular portion 12 of the ceramic substrate 10, corresponding to the extending portions of the high speed signal transmission lines 20A–20H respectively. The inward end portions of the plating tie-bars 70A–70H are connected to the corresponding extending portions of the high speed signal transmission lines 20A–20H respectively (see FIG. 1).

An example of such a construction is explained in detail with a connecting construction among the high speed signal transmission line 20D, via hole 23 and plating tie-bar 70D, as shown in FIGS. 1 and 2. Extending portion 24 of the high speed signal transmission line 20D from the via hole 23 is formed to extend toward the outer periphery edge 12a of the annular portion 12 in a U-shaped configuration closer to the outer periphery edge 12a than the connecting portion of the via hole 23 with the high speed signal transmission line 20D. The plating tie-bar 70D is formed and connected with a possible short length between a portion of the outer periphery edge 12a of the ceramic substrate 10 and the most-left end portion of the extending portion 24 of the high speed signal transmission line 20D shown in FIGS. 1 and 2. In addition, the reference characters 21a and 22a indicate an electric source pattern or a ground pattern respectively.

Figure 4:
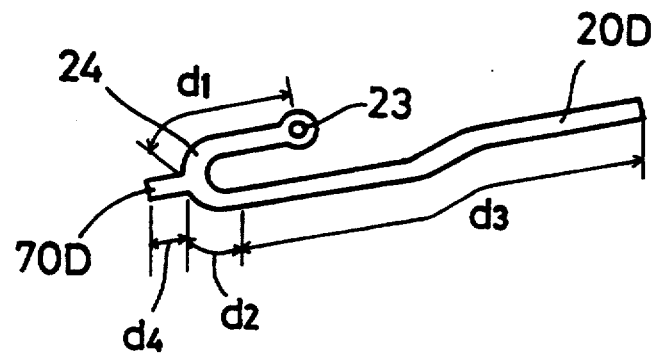
FIG. 4 is a plan view of a construction given by a high speed signal transmission line, the corresponding plating tie-bar and the corresponding via hole of FIG. 2.

In the first embodiment constructed as described above, when a high speed signal current i flows into the pin 50d, the high speed signal current i flows through the via hole 23 into the high speed signal transmission line 20D from its other end portion (see FIGS. 2 to 4). Subsequently, the high speed signal current i flowing into the high speed signal transmission line 20D flows toward the bonding pad through the extending portion 24 of the high speed signal transmission line 20D. In this instance, a portion of the high speed signal current i flows into the plating tie-bar 70D connected to the extending portion 24.

Incidentally, it is assumed that d1 indicates a length of the connected portion of the extending portion 24 with the via hole 23. It is also assumed that d2 indicates a length of a transmission line portion (a transmission line portion affected by the plating tie-bar 70D) which requires a transmission time equal to a return transmission time for the plating tie-bar 70D in the remaining portion of the extending portion 24 and a portion of the high speed signal transmission line 20D except the extending portion 24. Furthermore, it is assumed that d3 indicates a transmission line portion (a transmission line which may not be affected by the plating tie-bar 70D) except a portion of the high speed signal transmission line 20D corresponding to the sum of d1 and d2 and that d4 indicates the length of the plating tie-bar 70D.

Figure 5:
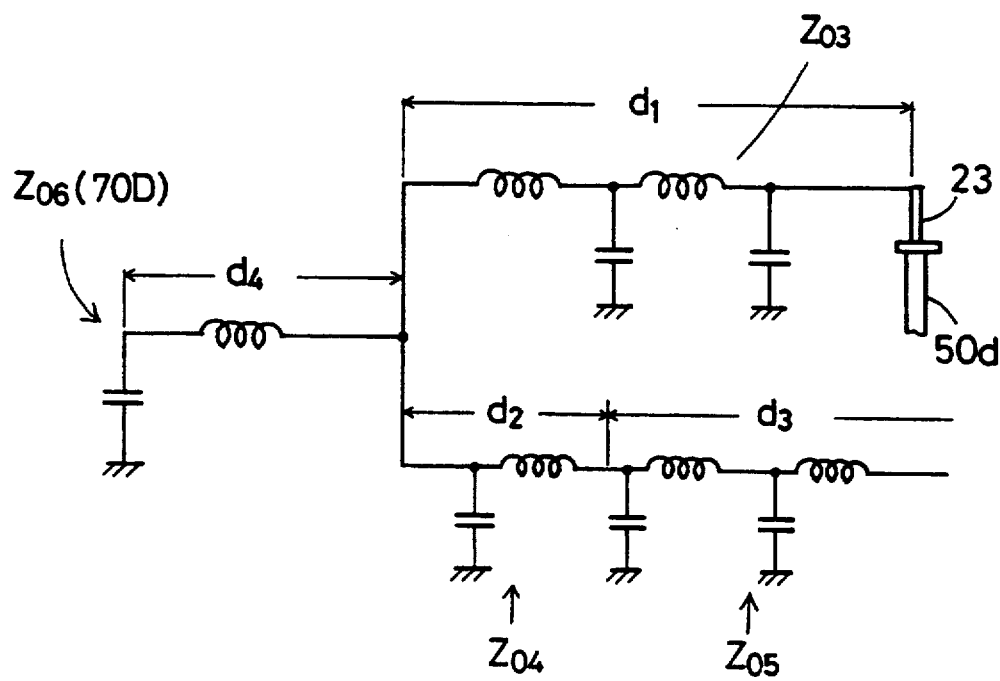
FIG. 5 is a circuit diagram represented equivalently by a distribution constant circuit.

Premising such matters, the construction shown in FIG. 3 is defined by a distribution constant circuit formed by inductances L and capacitances C shown in FIG. 5. It is assumed that Z03, Z04, Z05 and Z06 (Z03=Z05=Z06) represent characteristic impedances of transmission line portions corresponding to d1, d2 and d3 and a portion(plating tie-bar 70D) corresponding to d4 respectively. Since Z03 and Z05 may not be affected by the plating tie-bar 70D in the distribution constant circuit of FIG. 5, they maintain designed values Z03, Z05 respectively. Meanwhile, Considering that a parallel circuit is formed by the plating tie-bar 70D and a portion affected by the plating tie-bar 70D, a synthetic characteristic impedance ZOO of the parallel circuit is given by Z00=Z04·Z06/(Z04+Z06). In this case, Z00=($\frac{1}{2}$)·Z04, because Z04 is nearly equal to Z06. Thus, the characteristic impedance of the portion affected by the plating tie-bar is reduced to a half. Considering the plating tie-bar 70D is short, however, the characteristic impedance returns to Z05 on a transmission line portion of the length d3 locating ahead of the transmission line portion of the length d2 affected by the plating tie-bar 70D. This means that a length of a region in which a line impedance to be originally constant over all of the high speed signal transmission line changes in appearance due to influence of the plating tie-bar may be made shorter than that of the prior art. Thus, delay in propagation of the signal caused by change of a signal waveform of the high speed signal may be remained in minimum.

Figure 6:
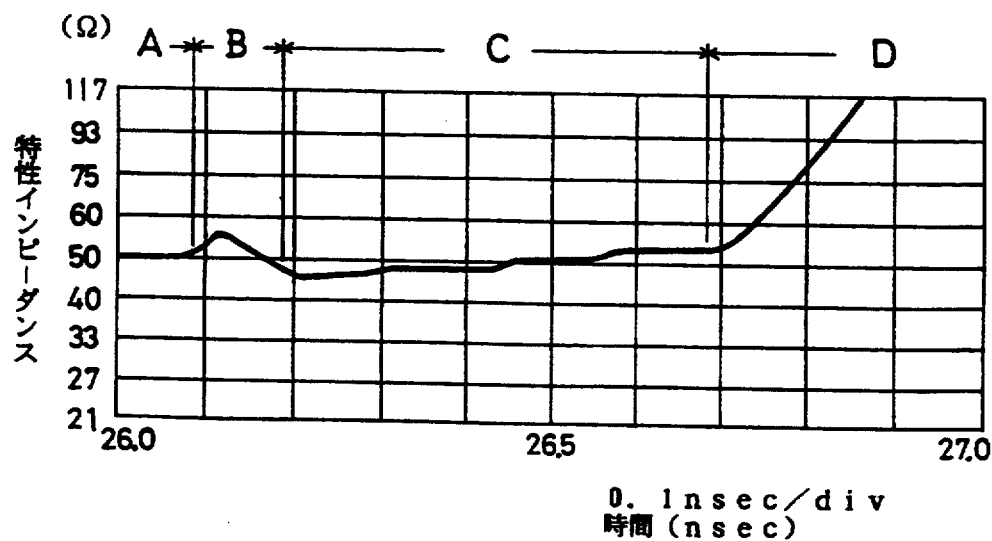
FIG. 6 is a graph indicative of characteristic impedances of the high speed signal transmission line and plating tie-bar of FIG. 4 which have been measured by the TDR measurement method.
Figure 22:
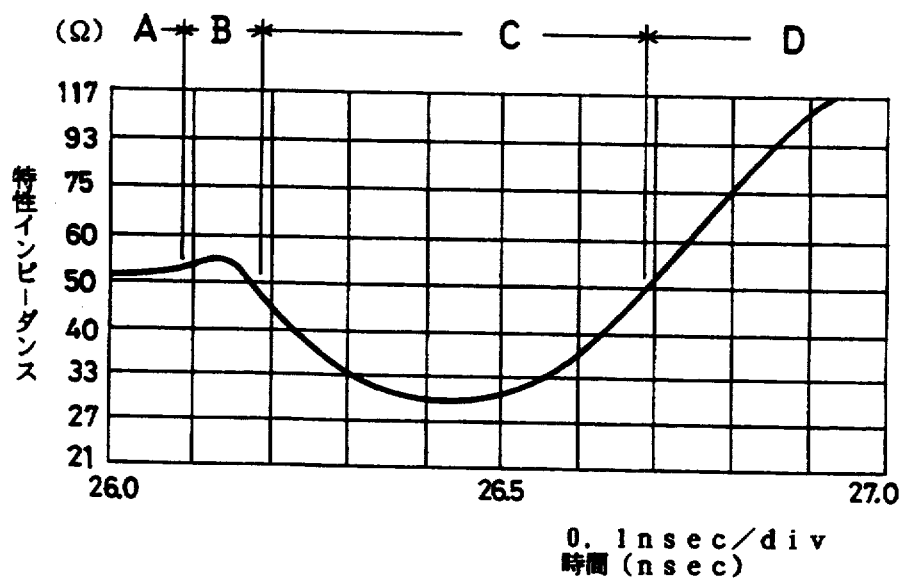
FIG. 22 is a graph indicative of characteristic impedances of the high speed signal transmission line and plating tie-bar of FIG. 20 which have been measured by the TDR measurement method.

Incidentally, the inventors have measured such characteristics with the TDR measurement method. With the measurement, in the first embodiment, measured result shown in FIG. 6 has been obtained by flowing the high speed signal current i into the high speed signal transmission line 20D and plating tie-bar 70D through the measuring cable (the 50-ohm coaxial cable), measuring probe and via hole 23. In this instance, it is assumed that the designed characteristic impedance of the high speed signal transmission line 20D is 50 ohms and that the one end portion of the high speed signal transmission line 20D (a portion to be connected to the integrated circuit 40) is opened. In FIG. 6, the axis of abscissas represents return transmission time or return reflection location of the high speed signal current i, whereas the axis of ordinates represents characteristic impedances of the measuring cable, measuring probe, via hole 23, high speed transmission line 20D and plating tie-bar 70D at the corresponding return transmission time or corresponding transmission reflection location of the high speed signal current i. In this case, in FIG. 6 the regions A–D correspond to the regions A–D in FIG. 22 respectively.

With the region C of FIG. 6, it is recognized that the synthetic characteristic impedance ZOO does hardly lower and maintains about 50 ohms. This means that a length of a region in which the characteristic impedance lowers due to influence of the plating tie-bar is shorter than a length recognizable by the TDR measurement. In other words, in the initial portion of the region C, there ought to be a region in which the characteristic impedance lowers down to about a half (25 ohms) of the designed characteristic impedance. However, it is shown that influences of the plating tie-bar to the characteristic impedance of the high speed signal transmission line becomes small to the extent that lowering of the characteristic impedance may not be measured by the TDR measurement method. Thus, it can be said that with the embodiment, -the characteristic impedance of the high speed signal transmission line 20D may be substantially maintained to be the designed characteristic impedance.

As previously described, in the embodiment the extending portion 24 of the high speed signal transmission line 20D from the via hole 23 is formed to extend curvedly toward the outer periphery edge 12a of the ceramic substrate 10 such that it approaches the outer periphery edge 12a of the ceramic substrate 10 more closely than the connecting portion of the via hole 23 with the high speed signal transmission 20D. The plating tie-bar 70D is formed and connected with a length shortened as much as possible between a portion of the outer periphery edge 12a of the ceramic substrate 10 and a most-left end of the extending portion 24 of the high speed signal transmission line 20D shown in FIGS. 1, 2. Extending portions of the remaining high speed signal transmission lines 20A, 20B, 20C, 20E, 20F, 20G and 20H from via holes connected to the pins 50a, 50b, 50c, 50e, 50f, 50g and 50h respectively are formed to extend curvedly toward the outer periphery edge 12a of the ceramic substrate 10 such that they approach the outer periphery edge 12a of the ceramic substrate 10 more closely than connecting portions of the corresponding via holes with the corresponding high speed signal transmissions. The plating tie-bars 70A, 70B, 70C, 70E, 70F, 70G and 70H are formed and connected with a length shortened as much as possible between a portion of the outer periphery edge 12a of the ceramic substrate 10 and most-left ends of the extending portions of the corresponding high speed signal transmission lines shown in FIG. 1 respectively.

Therefore, the length of the plating tie-bar 70D becomes considerably shorter than the length of the conventional plating tie-bar 70d by connecting the plating tie-bar 70D to the extending portion 24 of the high speed signal transmission line 20D as shortly as possible without connecting the plating tie-bar 70D to the via hole 23 like the plating tie-bar 70d. Likewise, lengths of the plating tie-bars for the other high speed signal transmission lines become considerably shorter than lengths of the corresponding conventional plating tie-bars by connecting the plating tie-bars 70A, 70B, 70C, 70E, 70F, 70G and 70H to the curvedly extending portions of the corresponding high speed signal transmission lines 20A, 20B, 20C, 20E, 20F, 20G and 20H as shortly as possible.

Thus, bad influences of the plating tie-bars for high speed signal transmission lines to the characteristic impedances of the corresponding high speed signal transmission lines or lowering of these characteristic impedances may be prevented surely. As a result, even if the plating tie-bars for high speed signal transmission lines are connected to the corresponding high speed signal transmission lines, high speed signal currents from the pins for high speed signal input-output flow through the corresponding high speed signal transmission lines with hardly any influences against impedances of the corresponding plating tie-bars. The matters described above are also attained likewise in case the high speed signal currents flow into the corresponding high speed signal transmission lines from the integrated circuit 40.

In addition, in the above first embodiment it has been explained an example that the pins are secured to the bottom surface of the annular portion 12. However, the pins may be also arranged and secured on the upper surface of the annular portion 12 in a lattice configuration.

Figure 7:
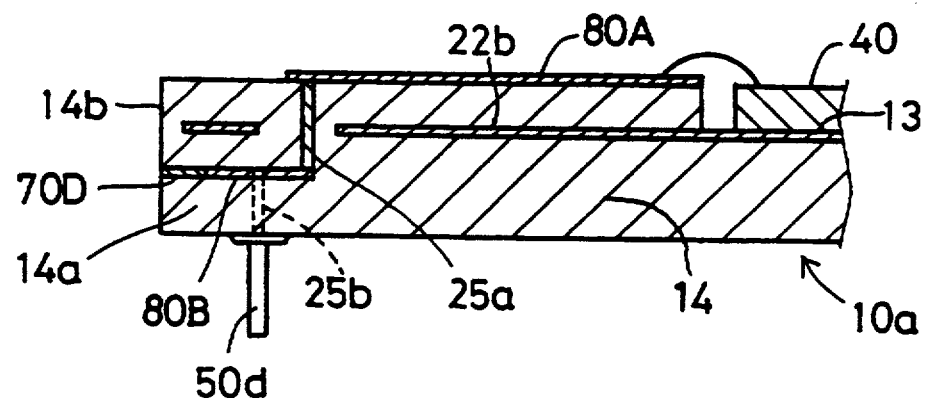
FIG. 7 is a cross-sectional view of a package body for a pin grid array type integrated circuit of a microstrip line structure showing a second embodiment of the present invention and taken along a line 7—7 of FIG. 8.
Figure 8:
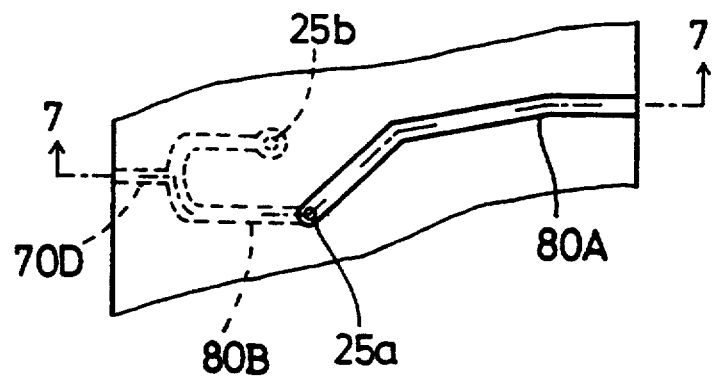
FIG. 8 is a partially enlarged broken plan view of FIG. 7.

Next, the second embodiment of the present invention will be explained with reference to FIGS. 7 and 8. The second embodiment is characterized in that in the package body for the pin grid array type integrated circuit described in the first embodiment, a ceramic substrate 10a with a microstrip line structure is, as shown in FIG. 7, adapted in replacement of the substrate 10 with the strip line structure.

The ceramic substrate 10a is provided with a chip cavity 13 and an annular portion 14 corresponding respectively to the chip cavity 11 and annular portion 12 of the ceramic substrate 10. In the chip cavity 13, the integrated circuit 40 described in the first embodiment is mounted. In the above-mentioned microstrip line structure, a plurality of main high speed signal transmission lines (in FIGS. 7,8 only the main high speed signal transmission line 80A is shown.) and a plurality of main low speed signal transmission lines (not shown) are formed to extend radially from the peripheral wall of the chip cavity 13 on the upper surface of the annular portion 14 with the characteristic impedance maintained in a constant, like the high speed signal transmission lines and low speed signal transmission lines described in the first embodiment. In addition, one end portions of these main high speed signal transmission lines and main low speed signal transmission lines act a role as a bonding pad respectively.

Within an outer periphery portion 14a of the annular portion 14, subsidiary high speed signal transmission lines (in FIGS. 7, 8 only the subsidiary high speed signal transmission line 80B is shown.) and subsidiary low speed signal transmission lines (not shown) are formed, corresponding to the main high and low speed signal transmission lines respectively. These subsidiary high and low speed signal transmission lines are connected at their base portions to extending tip portions of the corresponding main high and low speed signal transmission lines through corresponding via holes (In FIG. 7 only the via hole 25a is shown.) in the annular portion 14 and form a single transmission line respectively. For instance, the subsidiary high speed signal transmission line 80B is, as shown in FIG. 8, connected at its base portion to the extending tip portion of the main high speed signal transmission line 80A through the via hole 25a and forms a single transmission line together with the main high speed signal transmission line 80A. The subsidiary high speed signal transmission line 80B is formed to extend curvedly toward the outer periphery edge 14b of the annular portion 14 so as to approach more closely to the outer peripheral edge 14b than a via hole 25b described below, like the extending portion 24 of the high speed signal transmission line 20D in the first embodiment.

On the annular portion 14, pins for high speed signal input-output (In FIG. 7 only the pin 50d in the first embodiment is shown) and pins for low speed signal input-output (not shown) are arranged and secured in a lattice configuration, corresponding to tip portions (corresponding to the other portions described in the first embodiment) of the subsidiary high and low speed signal transmission lines. The secured portions of these pins are connected to the tip portions of the subsidiary high and low speed signal transmission lines through via holes (In FIGS. 7, 8 only the via hole 25b is shown.) respectively. For instance, the pins 50d is connected to the tip portion of the subsidiary high speed signal transmission line 80B through the via hole 25b.

Within the annular portions 14, plating tie-bars for the subsidiary high speed signal transmission lines (In FIGS. 7, 8 only the plating tie-bar 70D in the first embodiment is shown.) and plating tie-bars for the subsidiary low speed signal transmission lines (not shown) are formed from the tip portions of the corresponding subsidiary high and low speed signal transmission lines to the outer periphery edge 14b. The plating tie-bars for the subsidiary high speed signal transmission lines are formed as shortly as possible respectively. For instance, the plating tie-bar 70D is connected to the curvedly extending portion of the subsidiary high speed signal transmission line 80B (see FIGS. 7, 8). Additionally, in FIG. 7 the reference character 22b represents a ground pattern.

In the second embodiment as constructed above, when a high speed signal current i flows into the pin 50d like the first embodiment, the high speed signal current i flows into the subsidiary high speed signal transmission line 80B at its tip portion through the via hole 25b. Then, the high speed signal current i which has flowed into the subsidiary high speed signal transmission line 80B flows into the subsidiary high speed signal transmission line 80A through the via hole 25a. At this instance, a portion of the high speed signal current i flows into the plating tie-bar 70D. In this case, influences of the plating tie-bar 70D to the characteristic impedance of the high speed signal transmission line may be largely reduced compared with the prior art because the length of the plating tie-bar 70D is short.

Thus, the characteristic impedances of the subsidiary and main high speed signal transmission lines 80B and 80A are maintained substantially in their designed impedances. Therefore, the high speed signal current i from the pin 50d flows toward the integrated circuit 40 through the subsidiary high speed signal transmission line 80B, via hole 25b and main high speed signal transmission line 80A with hardly any influences caused by the plating tie-bar 70D under substantially maintaining the designed impedances of the subsidiary and main high speed signal transmission lines 80B and 80A because the plating tie-bar 70D is short in spite of presence thereof. The above-mentioned matters are attained likewise in case the high speed signal current i flows into the main high speed signal transmission line 80A from the integrated circuit 40.

Figure 9:
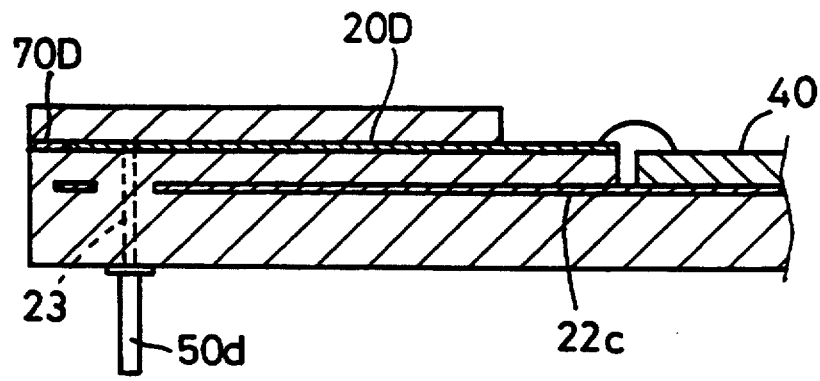
FIG. 9 is a partially enlarged cross-sectional view showing a modification of the second embodiment.

In addition, an example wherein the microstrip line structure is adapted as a signal transmission structure has been explained in the second embodiment. However, an embedded microstrip line structure may be adapted in replacement of the microstrip line structure, as shown in FIG. 9. In this case, the construction of the modification is like the construction shown in FIG. 3 except that in FIG. 3 a ground pattern or electric source pattern is eliminated and a ground pattern 22c is replaced with the ground pattern 22a.

Figure 10:
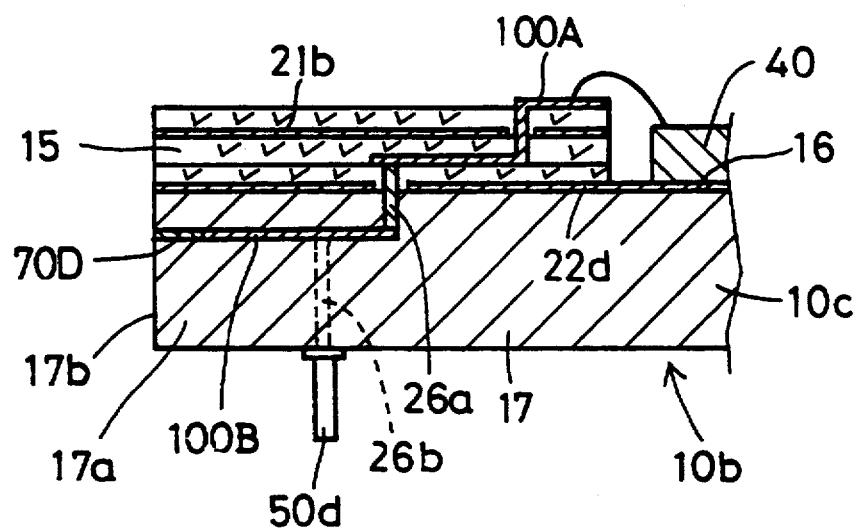
FIG. 10 is a cross-sectional view of a package body for a pin grid array type integrated circuit of a strip line structure indicating a third embodiment of the present invention and taken along a line 10—10 of FIG. 11.
Figure 11:
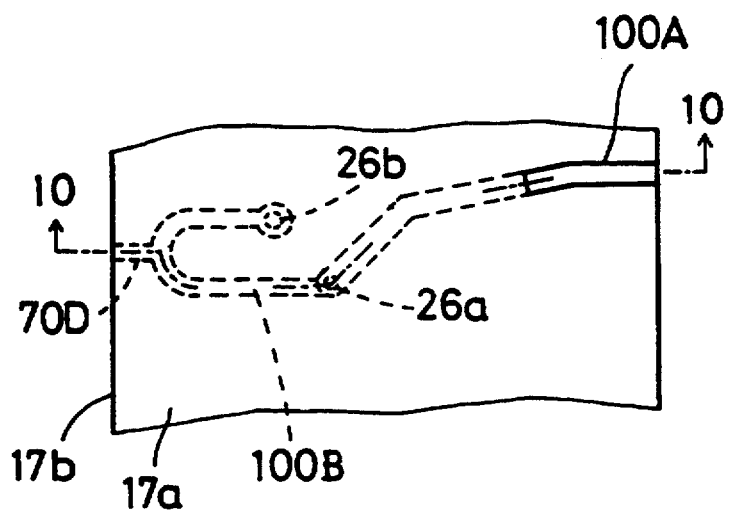
FIG. 11 is a partially broken plan view of FIG. 10.

Next, the third embodiment of the present invention will be explained with respect to FIGS. 10 and 11. This third embodiment is characterized in that in the package body for the pin grid array type integrated circuit described in the first embodiment, a ceramic thin film multi-layer substrate 10b having a strip line structure is adopted, as shown in FIG. 10, in replacement of the ceramic substrate 10 with the strip line structure.

The ceramic thin film multi-layer substrate 10b is provided with a multi-layer thin film 15. The multi-layer thin film 15 is formed by coating and curing insulation material such polyimide, benzocyclo butene, epoxy resin or the like on the ceramic substrate 10c in the form of the thin film multi-layer. The ceramic thin film multi-layer substrate 10b is provided with a chip cavity 16 and an annular portion 17 corresponding to the chip cavity 11 and annular portion 12 of the ceramic substrate 10 respectively. In the chip cavity 16, the integrated circuit 40 described in the first embodiment is mounted. In the above-mentioned strip line structure, a plurality of main high speed signal transmission lines (In FIGS. 10, 11 only the main high speed signal transmission line 100A is shown.) and a plurality of main low speed signal transmission lines (not shown) are formed to extend radially from the outer peripheral wall of the chip cavity 16 through the upper surface of the annular portion 17 or multi-layer thin film 15 into the same multi-layer thin film 15 with characteristic impedances maintained in constant like the high and low speed signal transmission lines described in the first embodiment. In this case, the main high speed signal transmission line 100A is constructed by a transmission line portion formed on the surface of the multi-layer thin film 15 to be connected to the integrated circuit 40, a transmission line portion formed within the multi-layer thin film 15 in parallel to the upper surface of the annular portion 17 and a via hole formed vertically to both the transmission line portions within the multi-layer thin film 15 to interconnect these transmission line portions. The remaining main high speed signal transmission lines are also constructed likely. In addition, these main high and low speed signal transmission lines constitute bonding pads at their one end portions respectively.

Within the outer periphery portion 17a of the annular portion 17, subsidiary high speed signal transmission lines (In FIGS. 10, 11 only the subsidiary high speed signal transmission line 100B is shown.) and subsidiary low speed signal transmission lines (not shown) are formed to correspond to the main high speed signal transmission lines and main low speed signal transmission lines respectively. These subsidiary high and low speed signal transmission lines are connected at their base portions to extending tip portions of the corresponding main high and low speed signal transmission lines through the corresponding via holes (In FIG. 10 only the via hole 26 is shown) within the annular portion 17 and form a single transmission line respectively. For instance, the subsidiary high speed signal transmission line 100B is, as shown in FIGS. 10, 11, connected at its base portion to the extending tip portion of the main high speed signal transmission line 100A through the via hole 26a and forms a single transmission line together with the main high speed signal transmission line 100A. This subsidiary high speed signal transmission line 100B is formed to extend curvedly toward the outer periphery edge 17b of the annular portion 17 so as to approach more closely to the outer periphery edge 17b than a via hole 26b described later. Like the extending portion of the high speed signal transmission line 20D in the first embodiment. On the annular portion 17, pins for high speed signal input-output (In FIG. 10 only the pin 50d described in the first embodiment is shown.) and pins for low speed signal input-output (not shown) are arranged and secured to correspond to the tip potions (corresponding to the other portions described in the first embodiment) of the subsidiary high and low speed signal transmission lines in a lattice configuration. The secured portions of these pins are connected to the tip portions of the subsidiary high and low speed signal transmission lines through via holes (In FIGS. 10, 11 only the via hole 26b is shown.). For instance, the pin 50d is connected to the tip end portion of the subsidiary high speed signal transmission line 100B through the via hole 26b.

Within tile annular portion 17, plating tie-bars for the subsidiary high speed signal transmission lines (In FIGS. 10 and 11 only the plating tie-bar 70D is shown.) and plating tie-bars for the subsidiary low speed signal transmission lines (not shown) are formed from the tip portions of the subsidiary high and low speed signal transmission lines to the outer periphery edge 17b of the annular portion 17. The plating tie-bars for the subsidiary high speed signal transmission lines are formed as shortly as possible respectively. For instance, the plating tie-bar 70D is connected to the curvedly extending portion of the subsidiary high speed signal transmission line 100B (see FIGS. 10 and 11). In addition, the reference characters 21b and 22d indicate an electric source pattern or ground pattern.

In the third embodiment constructed as described above, when a high speed signal current i flows into the pin 50d like the first embodiment, this high speed signal current i flows into the subsidiary high speed signal transmission line 100B at its tip portion through the via hole 26b. Subsequently, the high speed signal current i which has flowed into the subsidiary high speed signal transmission line 100B as described above flows into the main high speed signal transmission line 100A through the via hole 26a. At this instance, a portion of the high speed signal current i flows into the plating tie-bar 70D. In this case, because the length of the plating tie-bar 70D is short, influences of the plating tie-bar 70D to the main high speed signal transmission line 100A may be reduced largely compared with the prior art.

Therefore, the characteristic impedances of the subsidiary and main high speed signal transmission lines 100B and 100A are maintained substantially in their designed impedances. Thus, in the strip line structure of the ceramic thin film multi-layer substrate 10b, the high speed signal current i from the pin 50d flows properly to the integrated circuit 40 through the subsidiary high speed signal transmission line 100B, via hole 26b and main high speed signal transmission line 100A with hardly influences of the impedance of the plating tie-bar 70D under substantially maintaining the designed impedances of the subsidiary and main high speed signal transmission lines 100B and 100A because the plating tie-bar 70D is short in spite of presence thereof. The matters described above is substantially the same as in the case that the high speed signal current i flows into the main high speed signal transmission line 100A from the integrated circuit 40.

Figure 12:
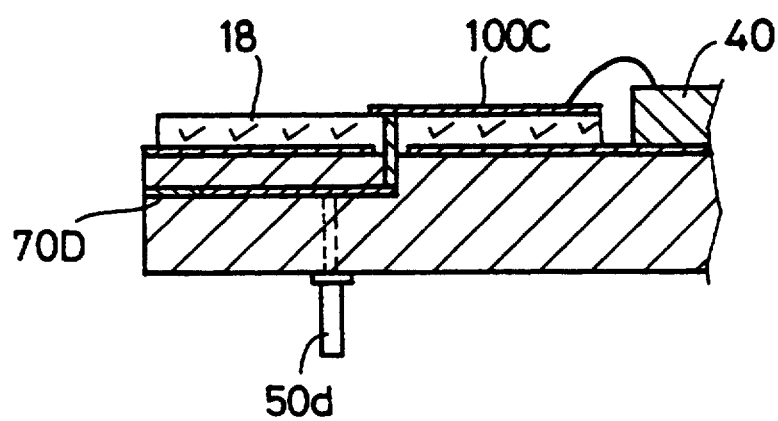
FIG. 12 is a partially cross-sectional view representing a modification of the third embodiment.
Figure 13:
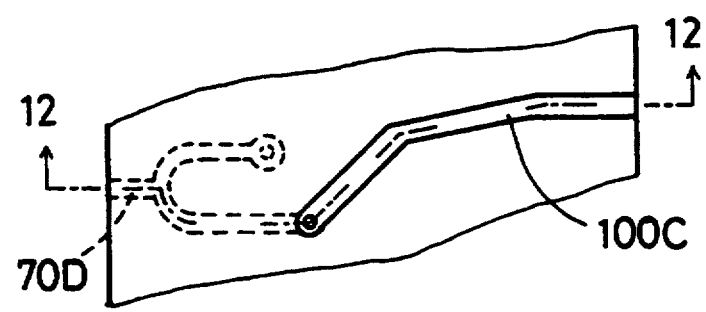
FIG. 13 is a partially plan view of the modification of the third embodiment.

FIGS. 12 and 13 illustrate a modification of the third embodiment. In the modification it is characterized in that the signal transmission structure is constructed by a microstrip line structure in replacement of the strip line structure. In this modification, a single layer thin film 18 is replaced with the multi-layer thin film 15 of FIG. 10 and a high speed signal transmission line 100C replaced with the main high speed signal transmission line 100A is formed on the single layer thin film 18. The other construction is the same as that of the third embodiment. With such microstrip line structure, the operation and effect like the third embodiment may be attained with respect to the short length of the plating tie-bar 70D.

Figure 14:
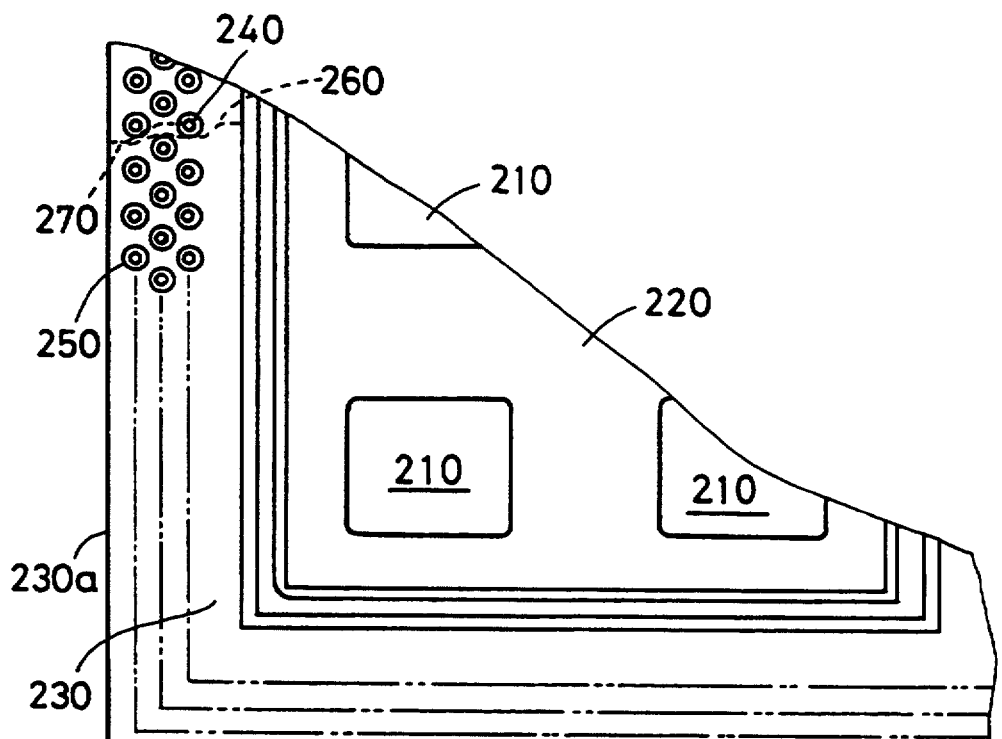
FIG. 14 is a broken plan view of a package body for a pin grid array type multi-tip module of a strip line structure indicating a fourth embodiment of the present invention.
Figure 15:
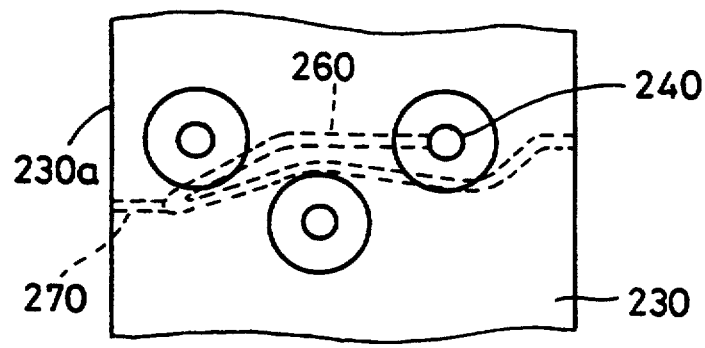
FIG. 15 is a partially enlarged broken plan view of FIG. 14.

FIGS. 14 and 15 illustrate a fourth embodiment of the present invention. In the fourth embodiment it is characterized in that a package body for a pin grid array type multiple integrated circuit (or multi-tip module) having a strip line structure is adapted in replacement of the package body for the pin grid array type integrated circuit described in the first embodiment.

The package body for the multi-tip module has a ceramic substrate 200. On the central portion of the ceramic substrate 200, a tip cavity 220 for mounting a plurality of integrated circuits 210—210 is formed. On an annular portion 230 of the ceramic substrate 200 located outside the tip cavity 220, plural pins for high speed signal input-output and plural pins for low speed signal input-output are mounted vertically in a lattice configuration. In FIGS. 14 and 15 a pin for high speed signal input-output is denoted by the reference character 240, and in FIG. 14 a pin for low speed signal input-output is denoted by the reference character 250.

Between the pin 240 and the corresponding integrated circuit 210, a high speed signal transmission line 260 is formed to extend toward the outer periphery edge 230a of the annular portion 230, as shown in FIG. 15. A plating tie-bar 270 for the high speed signal transmission line is formed and connected between the extending portion of the high speed signal transmission line 260 and the outer periphery edge 230a as shortly as possible. These constructions are also satisfied likely with respect to the other high speed signal transmission lines. Thus, with the package body for the pin grid array type multi-tip module having the strip line structure, operation and effect like the first embodiment may be attained.

Additionally, in the fourth embodiment there has been described an example that the present invention has been adapted to the package body for the pin grid array type multi-tip module having the strip line structure. However, the present invention may be adapted to a package body for a pin grid array type multi-tip module having a microstrip line structure.

Figure 16:
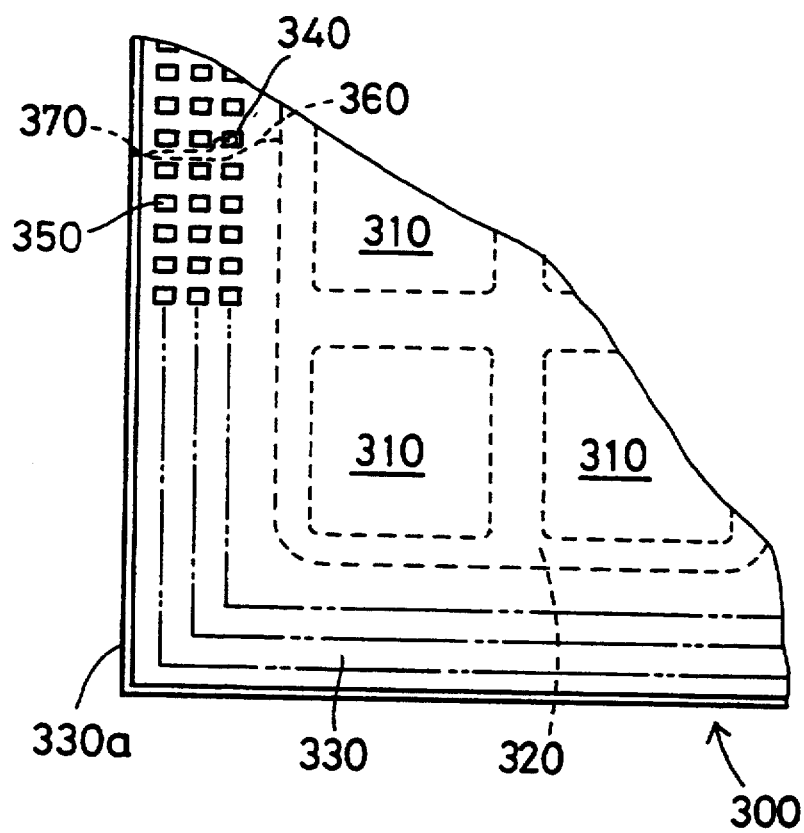
FIG. 16 is a broken plan view of a package body for a land grid array type multi-tip module of a strip line structure indicating a fifth embodiment of the present invention.
Figure 17:
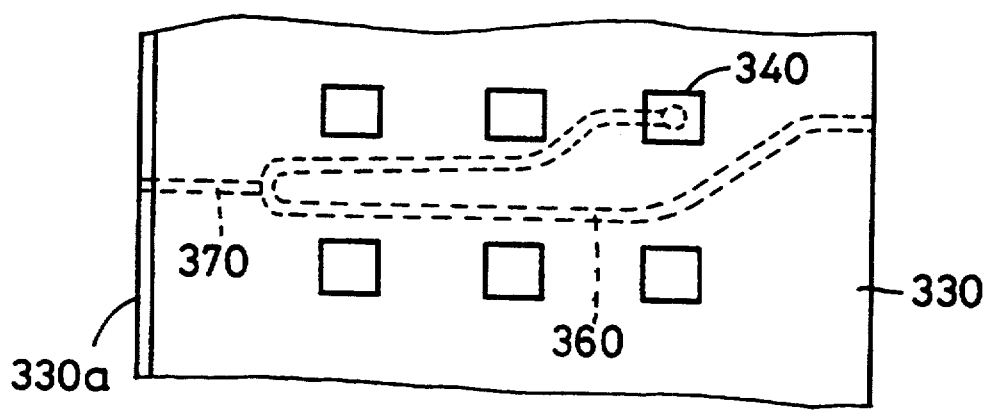
FIG. 17 is a partially broken plan view of the package body of FIG. 16.
Figure 18:
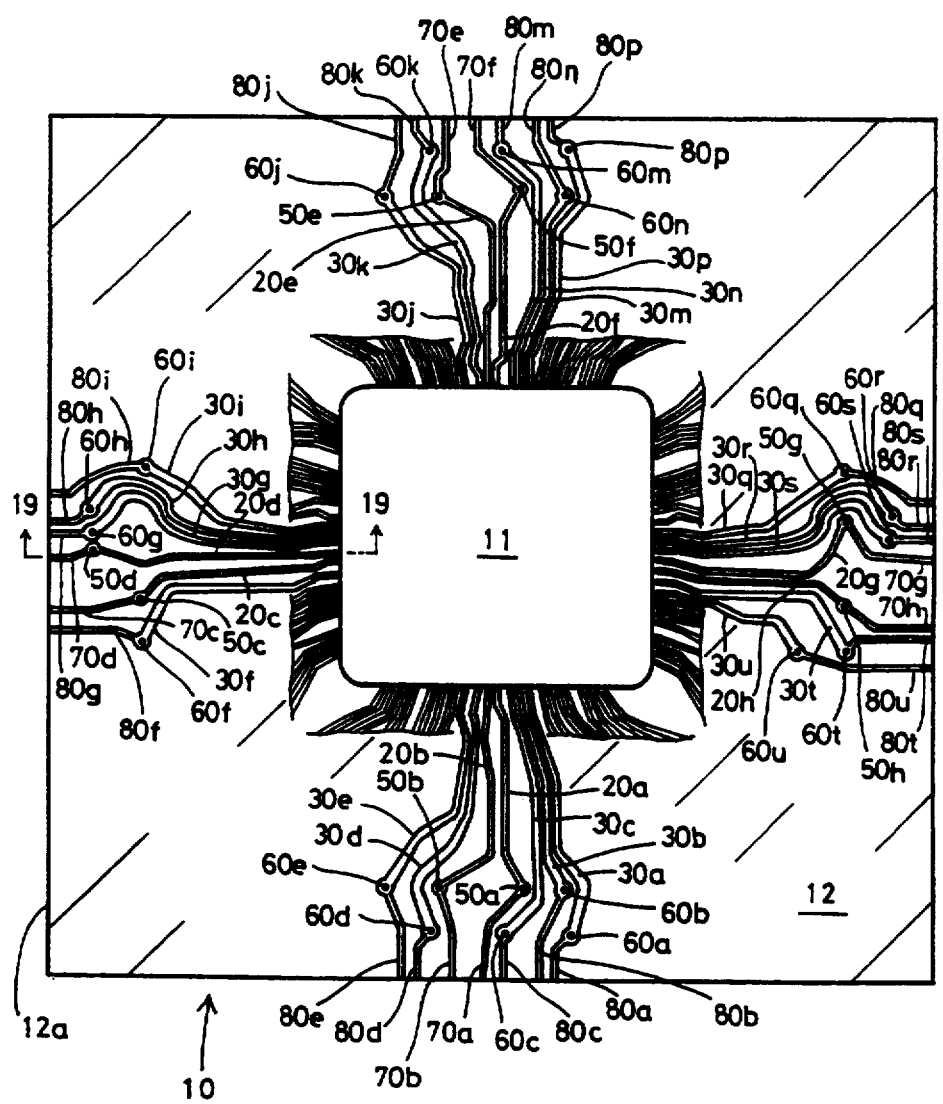
FIG. 18 is a cross-sectional view of a conventional package body for a pin grid array type integrated circuit of a strip line structure taken along a line 18—18 of FIG. 19.
Figure 19:
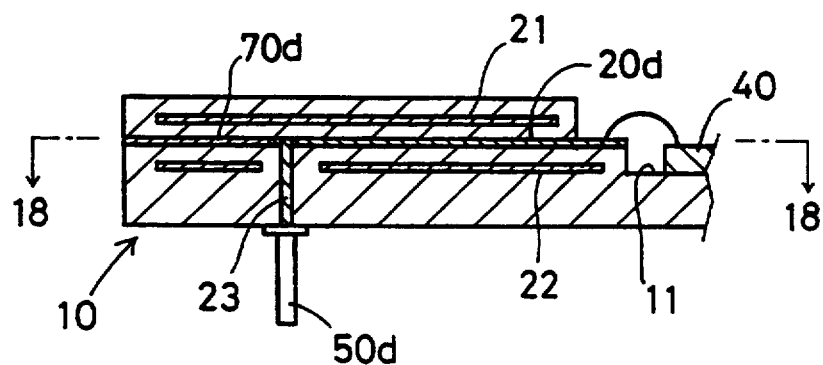
FIG. 19 is an enlarged cross-sectional view taken along a line 19—19 of FIG. 18.
Figure 20:
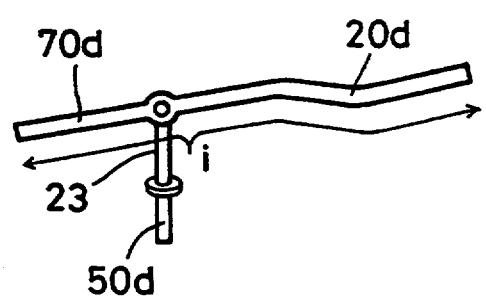
FIG. 20 is a view of a construction given by a high speed signal transmission line, the corresponding plating tie-bar and the corresponding via hole of FIG. 19.
Figure 21:
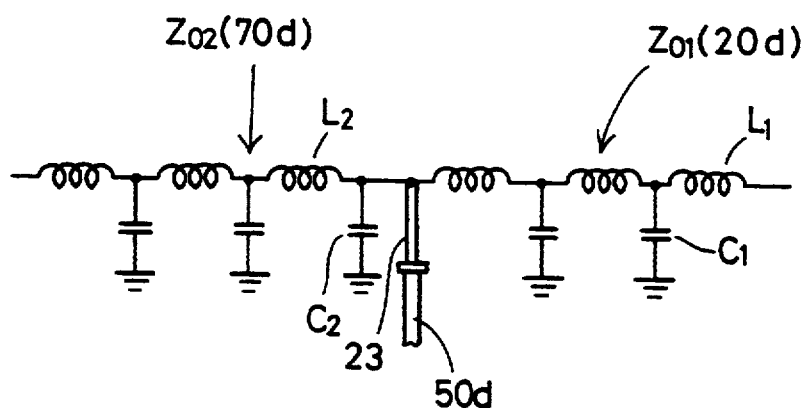
FIG. 21 is a circuit diagram of the construction of FIG. 20 represented equivalently by a distribution constant circuit.

FIGS. 16 and 17 illustrate a fifth embodiment of the present invention. In the fifth embodiment it is characterized in that a package body for a land grid array type multiple integrated circuit (or multi-tip module) having a strip line structure is adapted in replacement of the package body for the pin grid array type integrated circuit described in the first embodiment.

The package body for the multi-tip module has a ceramic substrate 300. On the central portion of the ceramic substrate 300, a tip cavity 320 for mounting a plurality of integrated circuits 310—310 is formed. On an annular portion 330 of the ceramic substrate 300 located outside the tip cavity 320, plural pads for high speed signal input-output and plural pads for low speed signal input-output are mounted in a lattice configuration. In FIGS. 16 and 17 a pad for high speed signal input-output is denoted by the reference character 340, and in FIG. 16 a pad for low speed signal input-output is denoted by the reference character 350.

Between the pad 340 and the corresponding integrated circuit 310, a high speed signal transmission line 360 is formed to extend toward the outer periphery edge 330a of the annular portion 330. A plating tie-bar 370 for the high speed signal transmission line is formed and connected between the extending portion of the high speed signal transmission line 360 and the outer periphery edge 330a as shortly as possible. These constructions are also satisfied likely with respect to other high speed signal transmission lines. Thus, with the package body for the land grid array type multi-tip module having the strip line structure, operation and effect like the first embodiment may be attained.

In addition, in the third embodiment and its modification there has been described an example that the multi-layer thin film 15 or single layer thin film 18 formed by polyimide and the like have been adapted. However, it may be replaced with a multi-layer thick film or a single thick film formed by glass material.

Although in the fifth embodiment there has been described an example that the present invention is adapted to the package body for the land grid array type multiple tip module having the strip line structure, the present invention may be adapted to a package body for a land grid array type multiple tip module having a microstrip line structure.

In the above-mentioned embodiments and modifications, there has been described an example that a pin grid array structure or a land grid array structure is mounted on the annular portion of the ceramic substrate. However, the present invention may be also adapted to a pin grid array structure or a land grid array structure arranged on the whole bottom surface of the ceramic substrate.

In the above-mentioned embodiments and modifications, there has been described an example that the integrated circuit is provided in the tip cavity in face up configuration under wire bonding connection with signal transmission lines. However, the present invention may be adapted in case of connection with an integrated circuit by TAB (Tape Automated Bonding) or of connection with an integrated circuit by flip-chip method in which the integrated circuit is mounted on the ceramic substrate in face down configuration.

While in the above-mentioned embodiments and modifications there has been described an example that the present invention is adapted to only the high speed signal transmission lines, the present invention may be adapted to both of the high and low speed signal transmission lines. In this case, it becomes unnecessary to discriminate whether the signal lines connected to the plating tie-bars each is a high speed signal transmission line or a low speed signal transmission line.

For practice of the present invention, in general a portion of an intermediate portion of each of the above-mentioned high speed signal transmission lines may be formed more extendingly toward the outer periphery edge of the ceramic substrate than both the end portions of each of the high speed signal transmission lines, and the inwardly extending portion of each of the corresponding plating tie-bars may be connected to each of the extending portions of the high speed signal transmission lines. Such matters are the same as in the above-mentioned subsidiary high speed signal transmission lines, low speed signal transmission lines and subsidiary low speed signal transmission lines.

For practice of the present invention, the ceramic substrate described in the embodiments and modifications may be properly selected from alumina, aluminium nitride, glass ceramics, cordierire, mullite, silicon nitride or the like. And a ceramic substrate formed with such organic material as polyimide, epoxy resin or the like may be replaced with the ceramic substrate.

For practice of the present invention, the lattice arrangement of such signal input-output terminals as the pins, pads or the like may be modified into such two-dimensional arrangement as for instance zigzag configuration or the like.

Having now set forth preferred embodiments of the concept underlying the present invention, various other embodiments as well as certain variations and modifications of the embodiments shown and described herein will obviously occur to those skilled in the art upon becoming familiar with underlying concept. It is to be understood, therefore, that within the scope of the appended claims, the invention may be practiced otherwise than as specifically set as forth herein.

What is claimed is:

1. A package body for an integrated circuit provided with a substrate having a mounting portion for mounting said integrated circuit, a terminal member for high speed signal input-output provided on a portion of said substrate except the mounting portion of said substrate, a high speed signal transmission line having one end portion to be connected to said integrated circuit and the other end portion connected to said terminal member, said high speed signal transmission line being formed at a portion of said substrate except the mounting portion of said substrate, and a plating tie-bar formed at said substrate so as to extend from an outer periphery edge of said substrate inwardly for electrolytically plating the one end portion of said high speed signal transmission line and said terminal member;

wherein a portion of said high speed signal transmission line is arranged more extendingly toward the outer periphery edge of said substrate than the one and other end portions of said high speed signal transmission line, and the inwardly extending end portion of said plating tie-bar is connected to the extending portion of said high speed signal transmission line.

2. A package body for an integrated circuit as claimed in claim 1, wherein said high speed signal transmission line is formed within the interior portion of said substrate located outside the mounting portion of said substrate more extendingly toward the outer periphery edge of said substrate at a portion of said high speed signal transmission line than the one and other end portions of said high speed signal transmission line;

wherein said terminal member has a via hole formed within the interior portion of said substrate located outside the mounting portion of said substrate to be connected to the other end portion of said high speed signal transmission line and has a pin or pad for high speed signal input-output provided on a surface portion of said substrate except the mounting portion of said substrate; and wherein said plating tie-bar is formed within the interior portion of said substrate located outside the mounting portion of said substrate to be connected to the extending portion of said high speed signal transmission line at its inwardly extending end portion.

3. A package body for an integrated circuit as claimed in claim 1, wherein said high speed signal transmission line is formed on a surface portion of said substrate except the mounting portion of said substrate more extendingly toward the outer periphery edge of said substrate at a portion of said high speed signal transmission line than the one and other end portions of said high speed signal transmission line;

wherein said terminal men,her has a via hole formed within the interior portion of said substrate located outside the mounting portion of said substrate to be connected to the other end portion of said high speed signal transmission line and a pin or pad for high speed signal input-output provided on a surface portion of said substrate except the mounting portion of said substrate; and wherein said plating tie-bar is formed on a surface portion of said substrate except the mounting portion of said substrate to be connected to the extending portion of said high speed signal transmission line at its inwardly extending portion.

4. A package body for an integrated circuit as claimed in claim 1, wherein said substrate is provided with a ceramic substrate having a mounting portion for mounting said integrated circuit and is provided with a multi-layer or single layer membrane formed on one side surface portion of said ceramic substrate except the mounting portion of said ceramic substrate;

wherein said terminal member has a main via hole formed within the interior portion of said ceramic substrate located outside the mounting portion of said ceramic substrate and has a pin or pad for high speed signal input-output provided on the other surface portion of said ceramic substrate to be connected to said main via hole;

wherein said high speed signal transmission line is provided with a main high speed signal transmission line having one end portion to be connected to said integrated circuit and formed at said multi-layer or single layer membrane so as to extend from the one end portion of said main high speed signal transmission line, said high speed signal transmission line being provided with a subsidiary high speed signal transmission line formed within said ceramic substrate, corresponding to said multi-layer or single layer membrane and having a base end portion connected to the extending end portion of said main high speed signal transmission line through a subsidiary via hole and the other end portion connected to said main via hole;

wherein said subsidiary high speed signal transmission line is arranged more extendingly toward the outer periphery edge of said substrate at a portion thereof than the one end portion of said main high speed signal transmission line and the other end portion of said subsidiary high speed signal transmission line; and wherein said plating tie-bar is formed within said ceramic substrate, corresponding to said multi-layer or single layer membrane, so as to extend form the outer periphery edge of said ceramic substrate inwardly and is connected at its inwardly extending end portion to the extending portion of said subsidiary high speed signal transmission line.

5. A package body for an integrated circuit as claimed in claim 4, wherein said main high speed signal transmission line is formed on a surface of said multi-layer or single layer membrane so as to extend from its one end portion to be connected to said integrated circuit.

6. A package body for an integrated circuit as claimed in claim 1, wherein said substrate has a mounting portion for mounting a plurality of integrated circuits;

wherein said high speed signal transmission line has one end portion to be connected to one of said integrated circuits and is arranged more extendingly toward the outer periphery edge of said substrate at its portion than the one and other end portions of said high speed signal transmission line; and wherein said plating tie-bar is connected at its inwardly extending portion to the extending portion of said high speed signal transmission line.

7. A package body for an integrated circuit as claimed in claim 6, wherein said high speed signal transmission line is formed within the interior portion of said substrate located outside the mounting portion of said substrate more extendingly toward the outer periphery edge of said substrate at a portion of said high speed signal transmission line than the one and other end portions of said high speed signal transmission line;

wherein said terminal member has a via hole formed within the interior portion of said substrate located outside the mounting portion of said substrate to be connected to the other end portion of said high speed signal transmission line and has a pin or pad for high speed signal input-output provided on a surface portion of said substrate except the mounting portion of said substrate; and wherein said plating tie-bar is formed within the interior portion of said substrate located outside the mounting portion of said substrate to be connected to the extending portion of said high speed signal transmission line at its inwardly extending end portion.

8. A package body for an integrated circuit as claimed in claim 6, wherein said high speed signal transmission line is formed on a surface portion of said substrate except the mounting portion of said substrate more extendingly toward the outer periphery edge of said substrate at a portion of said high speed signal transmission line than the one and other end portions of said high speed signal transmission line;

wherein said terminal member has a via hole formed within the interior portion of said substrate located outside the mounting portion of said substrate to be connected to the other end portion of said high speed signal transmission line and has a pin or pad for high speed signal input-output provided on a surface portion of said substrate except the mounting portion of said substrate; and wherein said plating tie-bar is formed on a surface portion of said substrate except the mounting portion of said substrate to be connected to the extending portion of said high speed signal transmission line at its inwardly extending end portion.

9. A package body for an integrated circuit provided with a substrate having a mounting portion for mounting said integrated circuit, plural terminal members for signal input-output provided on a portion of said substrate except the mounting portion of said substrate, plural signal transmission lines having one end portion to be connected to said integrated circuit and the other end portion connected to the corresponding terminal member of said plural terminal members respectively, said plural signal transmission lines being formed at a portion of said substrate except the mounting portion of said substrate, and plural plating tie-bars formed at said substrate so as to extend from an outer periphery edge of said substrate inwardly for electrolytically plating the one end portions of said these signal transmission lines and said terminal members respectively;

wherein a portion of each of said signal transmission lines is arranged more extendingly toward the outer periphery edge of said substrate than the one and other end portions of each of said signal transmission lines, and the inwardly extending end portion of each of the corresponding plating tie-bars is connected to the extending portion of each of said signal transmission lines.

10. A package body for an integrated circuit as claimed in claim 9, wherein each of said signal transmission lines is formed within the interior portion of said substrate located outside the mounting portion of said substrate more extendingly toward the outer periphery edge of said substrate at a portion of each of said signal transmission lines than the one and other end portions of each of said signal transmission lines;

wherein each of said terminal members has a via hole formed within the interior portion of said substrate located outside the mounting portion of said substrate to be connected to the other end portion of each of said signal transmission lines and has a pin or pad for signal input-output provided on a surface portion of said substrate except the mounting portion of said substrate; and wherein each of said plating tie-bars is formed within the interior portion of said substrate located outside the mounting portion of said substrate to be connected to the extending portion of each of said corresponding signal transmission lines at its inwardly extending portion.

11. A package body for an integrated circuit as claimed in claim 9, wherein each of said signal transmission lines is formed on a surface portion of said substrate except the mounting portion of said substrate more extendingly toward the outer periphery edge of said substrate at a portion of each of said signal transmission lines than the one and other end portions of each of said signal transmission lines;

wherein each of said terminal members has a via hole formed within the interior portion of said substrate located outside the mounting portion of said substrate to be connected to the other end portion of each of said signal transmission lines and a pin or pad for signal input-output provided on a surface portion of said substrate except the mounting portion of said substrate; and wherein each of said plating tie-bars is formed on a surface portion of said substrate except the mounting portion of said substrate to be connected to the extending portion of each of said signal transmission lines at its inwardly extending portion.

12. A package body for an integrated circuit as claimed in claim 9, wherein said substrate is provided with a ceramic substrate having a mounting portion for mounting said integrated circuit and is provided with a multi-layer or single layer membrane formed on one side surface portion of said ceramic substrate except the mounting portion of said ceramic substrate;

wherein each of said terminal members has a main via hole formed within the interior portion of said ceramic substrate located outside the mounting portion of said ceramic substrate and has a pin or pad for signal input-output provided on the other surface portion of said ceramic substrate to be connected to said main via hole;

wherein each of said signal transmission lines is provided with a main signal transmission line having one end portion to be connected to said integrated circuit and formed at said multi-layer or single layer membrane so as to extend from the one end portion of said main signal transmission line, each of said signal transmission lines being provided with a subsidiary signal transmission line formed within said ceramic substrate, corresponding to said multi-layer or single layer membrane, and having a base end portion connected to the extending end portion of said main signal transmission line through a subsidiary via hole and the other portion connected to said main via hole; and wherein each of said subsidiary high speed signal transmission line is arranged more extendingly toward the outer periphery edge of said substate at a portion thereof than the one end portion of said main signal transmission line and the other end portion of said subsidiary signal transmission line, and each of said plating tie-bars is formed within said ceramic substrate, corresponding to said multi-layer or single layer membrane, so as to extend form the outer periphery edge of said ceramic substrate inwardly and is connected at its inwardly extending end portion to the extending portion of each of the corresponding subsidiary signal transmission lines.

13. A package body for an integrated circuit as claimed in claim 12, wherein each of said main signal transmission lines is provided on a surface of said multi-layer or single layer membrane so as to extend from its one end portion to be connected to said integrated circuit.

14. A package body for an integrated circuit as claimed in claim 9, wherein said substrate has a mounting portion for mounting plural integrated circuits; and wherein each of said signal transmission lines has one end portion to be connected to one of said integrated circuits and is arranged more extendingly toward the outer periphery edge of said substrate at its one portion than the one and other end portions of each of said signal transmission lines, each of said signal transmission lines being connected at its extending portion to the corresponding inwardly extending end portion of each of said corresponding plating tie-bars.

15. A package body for an integrated circuit as claimed in claim 14, wherein each of said signal transmission lines is formed within the interior portion of said substrate located outside the mounting portion of said substrate more extendingly toward the outer periphery edge of said substrate at a portion of each of said signal transmission lines than the one and other end portions of each of said signal transmission lines;

wherein each of said terminal members has a via hole formed within the interior portion of said substrate located outside the mounting portion of said substrate to be connected to the other end portion of each of said signal transmission lines and has a pin or pad for signal input-output provided on a surface portion of said substrate except the mounting portion of said substrate; and wherein each of said plating tie-bars is formed within the interior portion of said substrate located outside the mounting portion of said substrate to be connected to the extending portion of each of said corresponding signal transmission lines at its inwardly extending end portion.

16. A package body for an integrated circuit as claimed in claim 14, wherein each of said signal transmission lines is formed on a surface portion of said substrate except the mounting portion of said substrate more extendingly toward the outer periphery edge of said substrate at a portion of each of said signal transmission lines than the one and other end portions of each of said signal transmission lines;

wherein each of said terminal members has a via hole formed within the interior portion of said substrate located outside the mounting portion of said substrate to be connected to the other end portion of each of said signal transmission lines and a pin or pad for signal input-output provided on a surface portion of said substrate except the mounting portion of said substrate; and wherein each of said plating tie-bars is formed on a surface portion of said substrate except the mounting portion of said substrate to be connected to the extending portion of each of the corresponding signal transmission lines at its inwardly extending end portion.

17. A package body for an integrated circuit as claimed in claim 9, wherein each of only the signal transmission lines used as high speed signal transmission lines of said plural signal transmission lines is arranged more extendingly toward the outer periphery edge of said substrate at a portion of each of said only the signal transmission lines than the one and other end portions of each of said only the signal transmission lines; and wherein the inwardly extending portion of each of the corresponding plating tie-bars is connected to the extending portion of each of said only the signal transmission lines.

* * * * *